(12) United States Patent
St. Germain et al.

(10) Patent No.: US 9,911,684 B1
(45) Date of Patent: Mar. 6, 2018

(54) HOLES AND DIMPLES TO CONTROL SOLDER FLOW

(71) Applicant: SEMICONDUCTOR COMPONENTS INDUSTRIES, LLC, Phoenix, AZ (US)

(72) Inventors: Stephen St. Germain, Gilbert, AZ (US); Dennis Lee Conner, Peoria, AZ (US); Jay A. Yoder, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 10 days.

(21) Appl. No.: 15/240,423

(22) Filed: Aug. 18, 2016

(51) Int. Cl.
*H01L 23/495* (2006.01)
*H01L 21/48* (2006.01)
*H01L 23/00* (2006.01)

(52) U.S. Cl.
CPC .... *H01L 23/49541* (2013.01); *H01L 21/4828* (2013.01); *H01L 21/4842* (2013.01); *H01L 23/49503* (2013.01); *H01L 23/49513* (2013.01); *H01L 23/49575* (2013.01); *H01L 24/32* (2013.01); *H01L 24/40* (2013.01); *H01L 24/73* (2013.01); *H01L 24/84* (2013.01); *H01L 2224/29191* (2013.01); *H01L 2224/32245* (2013.01); *H01L 2224/40245* (2013.01); *H01L 2224/73263* (2013.01); *H01L 2224/83192* (2013.01); *H01L 2224/83801* (2013.01); *H01L 2224/84801* (2013.01); *H01L 2224/92246* (2013.01); *H01L 2924/0665* (2013.01); *H01L 2924/0715* (2013.01); *H01L 2924/07025* (2013.01)

(58) Field of Classification Search
CPC ......... H01L 23/49541; H01L 23/49513; H01L 21/4828; H01L 24/32; H01L 24/40; H01L 24/84; H01L 23/49544; H01L 23/49565; H01L 23/49503; H01L 23/49575; H01L 21/4842
See application file for complete search history.

(56) References Cited

U.S. PATENT DOCUMENTS

| | | | | |
|---|---|---|---|---|
| 6,235,556 B1* | 5/2001 | MacPherson | ..... | H01L 23/49503 257/E23.037 |
| 6,448,507 B1* | 9/2002 | Fontecha | ................ | H01L 24/32 174/260 |
| 6,521,982 B1* | 2/2003 | Crowley | ........... | H01L 23/49513 257/139 |
| 7,081,666 B2* | 7/2006 | Joshi | ..................... | H01L 21/565 257/666 |
| 7,972,906 B2* | 7/2011 | Cruz | ................. | H01L 23/49524 257/706 |
| 7,999,281 B2* | 8/2011 | Shimokawa | ............ | H01L 24/32 257/622 |
| 8,982,577 B1* | 3/2015 | Fuentes | ................... | H01L 23/13 257/787 |

(Continued)

*Primary Examiner* — Marvin Payen
*Assistant Examiner* — Jeremy Joy
(74) *Attorney, Agent, or Firm* — Conley Rose, P.C.

(57) ABSTRACT

A system, in some embodiments, comprises: a first surface of a lead frame; a second surface of the lead frame, opposite the first surface, said second surface having been etched; and one or more holes passing through said lead frame and coincident with the first and second surfaces, wherein said one or more holes are adapted to control fluid flow on said first surface.

18 Claims, 11 Drawing Sheets

(56) References Cited

U.S. PATENT DOCUMENTS

| | | | | |
|---|---|---|---|---|
| 9,214,440 B1* | 12/2015 | Zhang | ................. | H01L 23/3142 |
| 2005/0236701 A1* | 10/2005 | Minamio | .............. | H01L 21/565 |
| | | | | 257/676 |
| 2007/0114352 A1* | 5/2007 | Cruz | .................... | H01L 21/561 |
| | | | | 248/316.7 |
| 2007/0241432 A1* | 10/2007 | Shim, II | .............. | H01L 21/4828 |
| | | | | 257/675 |
| 2011/0193208 A1* | 8/2011 | Xue | ........................ | H01L 24/37 |
| | | | | 257/676 |
| 2011/0298116 A1* | 12/2011 | Mizusaki | .............. | H01L 21/561 |
| | | | | 257/676 |
| 2013/0009295 A1* | 1/2013 | Otremba | ........... | H01L 23/49524 |
| | | | | 257/676 |
| 2013/0009297 A1* | 1/2013 | Tsui | ................. | H01L 23/49503 |
| | | | | 257/676 |
| 2015/0054147 A1* | 2/2015 | Cruz | ................. | H01L 23/49575 |
| | | | | 257/676 |
| 2016/0358843 A1* | 12/2016 | Arokiasamy | ..... | H01L 23/49513 |

\* cited by examiner

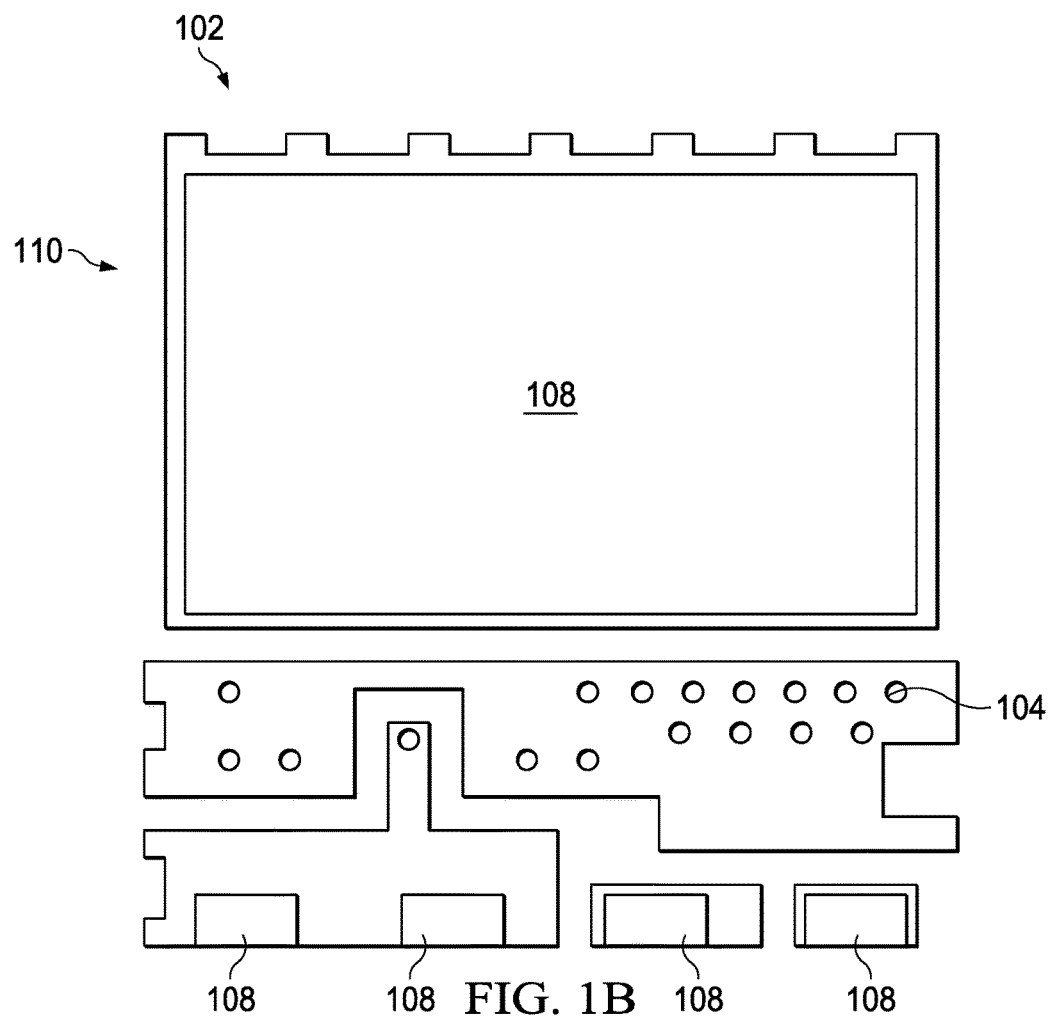
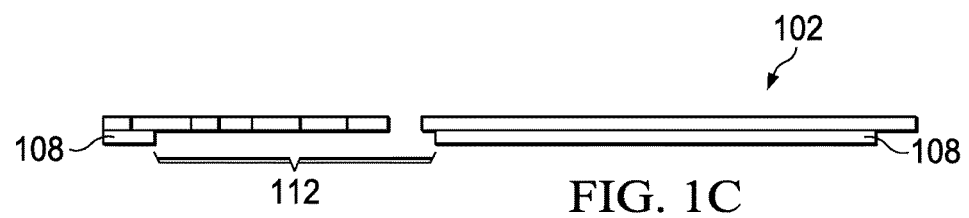

HOLES AND DIMPLES TO CONTROL SOLDER FLOW

BACKGROUND

Semiconductor packages include various components, such as lead frames, die, and different types of bonds. Often, these and other such components are coupled together using solder or a similar, viscous substance. Controlling the flow of solder on component surfaces is important, because insufficient solder in certain locations results in poor electrical connections, and because the presence of solder in other locations results in electrical shorts or other problems. Such control over solder flow, however, is difficult to achieve.

SUMMARY

At least some of the embodiments disclosed herein are directed to a system, comprising: a first surface of a lead frame; a second surface of the lead frame, opposite the first surface, said second surface having been etched; and one or more holes passing through said lead frame and coincident with the first and second surfaces, wherein said one or more holes are adapted to control fluid flow on said first surface. One or more of these embodiments may be supplemented using one or more of the following concepts, in any order and in any combination: wherein said fluid comprises reflowed solder; wherein said second surface comprises a half-etched area; further comprising fluid on the first surface, said fluid having a distribution on the first surface that is influenced at least in part by said one or more holes; further comprising fluid on the first surface, said fluid partially filling said one or more holes; further comprising fluid on the first surface, said fluid at least partially encircling an aperture of said one or more holes; further comprising fluid on the first surface, said fluid straddling an aperture of said one or more holes; further comprising fluid on the first surface, wherein said fluid is selected from the group consisting of epoxy, polyimide, silicone adhesives, hybrid organic adhesives, soft solder, and eutectic solder; further comprising a die coupled to the first surface using solder, a position of the die on the first surface is influenced at least in part by said one or more holes; further comprising a clip coupling said lead frame to the die using solder, said clip having one or more additional holes, a position of the clip relative to the die determined at least in part by said one or more additional holes; further comprising one or more dimples positioned on said first surface and opposite the second surface, said one or more dimples are adapted to control said fluid flow on the first surface.

At least some embodiments are directed to a system, comprising: a lead frame having a lead frame surface; and one or more dimples formed upon the lead frame surface, said one or more dimples adapted to control fluid flow on said lead frame surface. One or more of these embodiments may be supplemented using one or more of the following concepts, in any order and in any combination: further comprising a second lead frame surface opposite the lead frame surface, said second lead frame surface having been half-etched; further comprising fluid on the lead frame surface, a distribution of said fluid on the lead frame surface determined at least in part by said one or more dimples; further comprising a die coupled to the lead frame surface using fluid, a position of the die on the lead frame surface is influenced at least in part by said one or more dimples; further comprising one or more holes passing through the lead frame, said one or more holes adapted to control fluid flow on the lead frame surface.

At least some embodiments are directed to a method, comprising: etching at least a portion of a first surface of a lead frame; etching one or more holes or dimples on a second surface of the lead frame, said first and second surfaces opposing each other, said one or more holes or dimples configured to control solder flow; applying solder on the second surface of the lead frame; and reflowing said solder. One or more of these embodiments may be supplemented using one or more of the following concepts, in any order and in any combination: further comprising said one or more holes or dimples controlling flow of said reflowed solder; wherein etching one or more holes or dimples comprises etching at least one hole and at least one dimple, and wherein said at least one dimple has an aperture with a smaller diameter than an aperture of said at least one hole; further comprising forming at least one hole or dimple in a clip and using said clip to electrically couple a portion of said lead frame to a die.

BRIEF DESCRIPTION OF THE DRAWINGS

In the drawings:

FIG. 1B is a bottom-up view of the lead frame of FIG. 1A.

FIG. 1C is a side view of the lead frame of FIG. 1A.

Figure 1A:
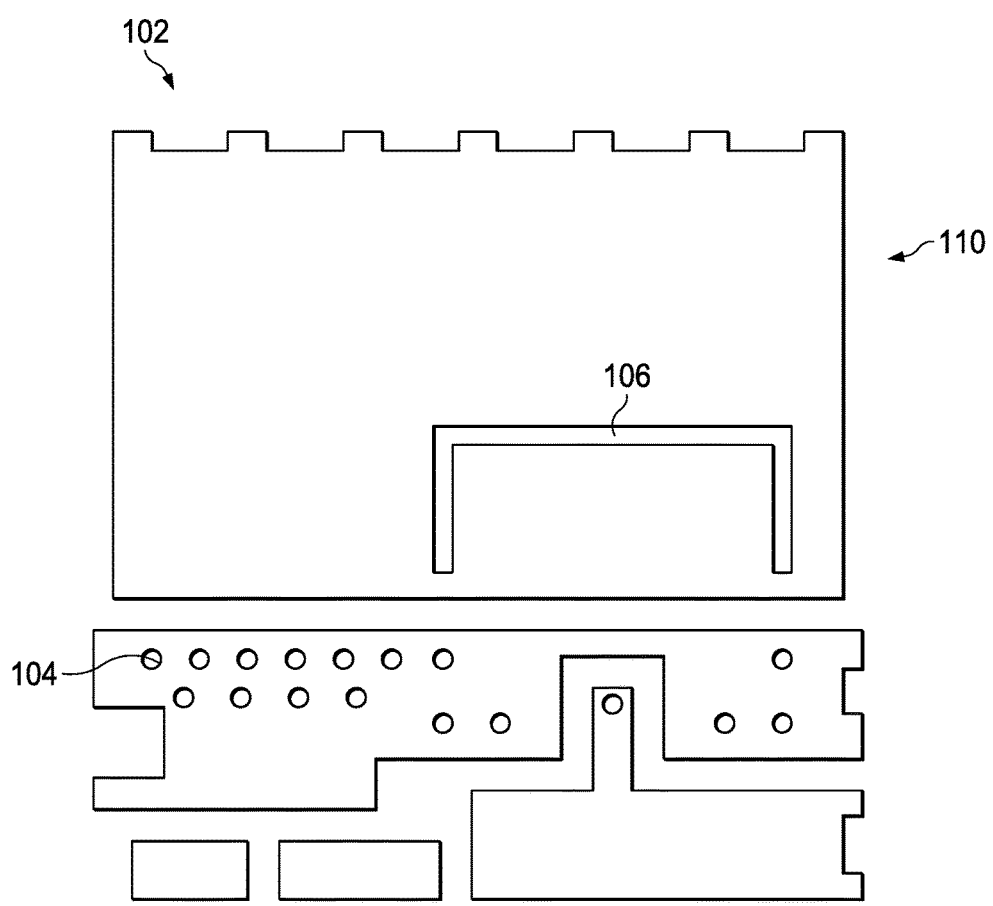
FIG. 1A is a top-down view of an illustrative lead frame having multiple holes.

It should be understood that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are lead frames having holes, dimples, or both formed therein to control the flow of die attach material (e.g., epoxy, polyimide, silicone or hybrid organic adhesives, soft or eutectic solders). By controlling the flow of die attach material, the undesirable effects of unrestrained die attach material flow—such as electrical shorts in some areas and/or poor electrical connections in other areas—are mitigated.

FIG. 1A is a top-down view of an illustrative lead frame 102. Lead frames are often composed of copper or copper-based alloys and are used to incorporate electronics—for example, integrated circuits and discrete devices (e.g., transistors, diodes)—into protective packages. The lead frames enable electrical signals to flow between the electronic device encapsulated within the package and electronic devices, such as a printed circuit board, outside the package. The lead frame 102 depicted in FIG. 1A and, more generally, the lead frames depicted in any portion of this disclosure do not limit the scope of this disclosure. The holes and dimples described herein may be formed in any suitable type of lead frame to control the flow of die attach material.

Still referring to FIG. 1A, the lead frame 102 comprises multiple holes 104. The holes 104 pass through the thickness of the lead frame 102 such that the apertures of each hole are on opposing surfaces of the lead frame 102. The holes 104 may be of any suitable diameter (e.g., a range of 0.1270 to 0.3048 mm, inclusive) depending on material thickness to achieve a through hole during the etching process, and may be formed in any suitable number, arrangement, and pitch. In at least some embodiments, the holes 104 are arranged between the area in which die attach material (e.g., solder) is to be deposited and the area that is to be protected from die attach material flow. Furthermore, the holes 104 may be formed in any suitable area of the lead frame 102, including leads, die flags, etc. The holes 104 preferably are formed during the lead frame etching process. Their sizes, quantities, and locations are determined by the masks used during the etching process. When die attach material is reflowed, the holes 104 (and dimples, which are described below) draw the die attach material toward themselves and away from the areas to be protected from the reflowed die attach material.

In at least some embodiments, the lead frame 102 includes at least one trench 106. Like the holes 104, one purpose of the trench 106 is to control the flow of die attach material. However, unlike the holes 104, the trench 106 does not pass completely through the thickness of the lead frame 102. When die attach material, such as solder, is reflowed, it approaches the trench 106 but—due to its tensile properties—does not enter the trench 106. Its resistance to flowing into the trench 106 helps maintain the desired position of the die or other component that is coupled to the die attach material. Stated another way, the trench 106 controls the flow of the die attach material and, because the die attach material flow is controlled, the die that is coupled to the die attach material is precluded from sliding or moving into undesirable positions. Instead, the die remains in its proper position.

FIG. 1B is a bottom-up view of the lead frame 102 of FIG. 1A. This view of the lead frame 102 depicts the holes 104, since—as explained above—the holes 104 pass completely through the lead frame 102. However, this view does not depict the trench 106, since—as explained—the trench 106 does not pass completely through the lead frame 102. In at least some embodiments, the holes 104 are formed on areas of the lead frame 102 that have been half-etched. The term "half-etched," as used herein, refers to a degree of etching that causes an area of a lead frame 102 to be approximately half the thickness (i.e., between 25 and 75%, inclusive) of another, non-half-etched area of the lead frame (depicted as numerals 108 in FIG. 1B). Unlike the holes 104, which are formed on areas of the lead frames that have been half-etched, the trench 106 is formed on an area of the top surface of the lead frame (FIG. 1A) that is opposite an area of the bottom surface that is not half-etched—e.g., one of the areas 108, as shown. Were the trench 106 formed in an area that is half-etched, it would create a significant, continuous aperture in the lead frame and would thus compromise the structural integrity of the lead frame. The holes 104, though formed in half-etched areas, do not compromise the structural integrity of the lead frame because they are comparatively small and are separated from each other.

Figure 2A:
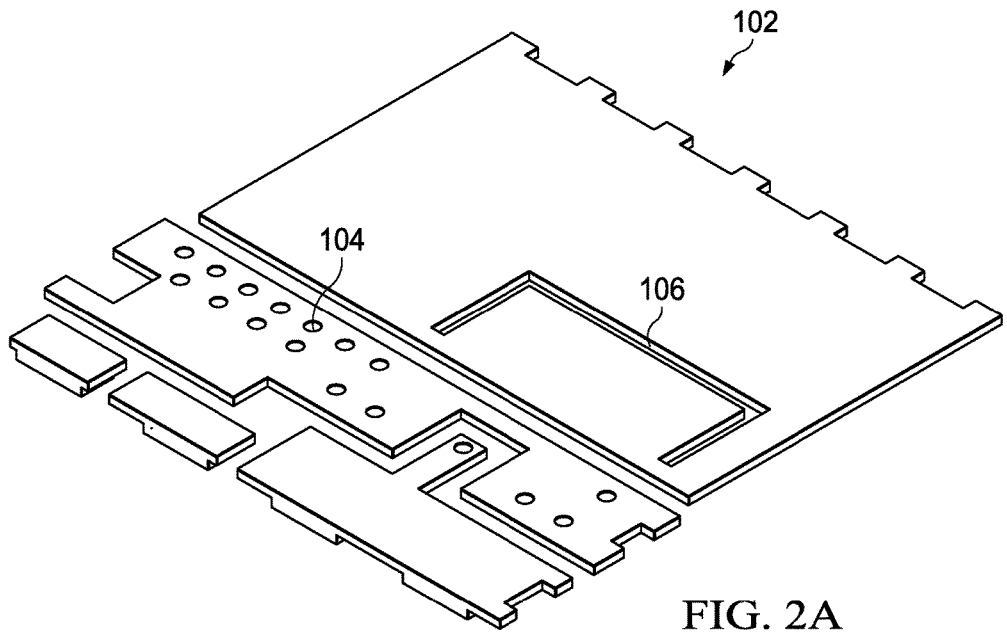
FIG. 2A is a perspective view of the lead frame surface depicted in FIG. 1A.
Figure 2B:
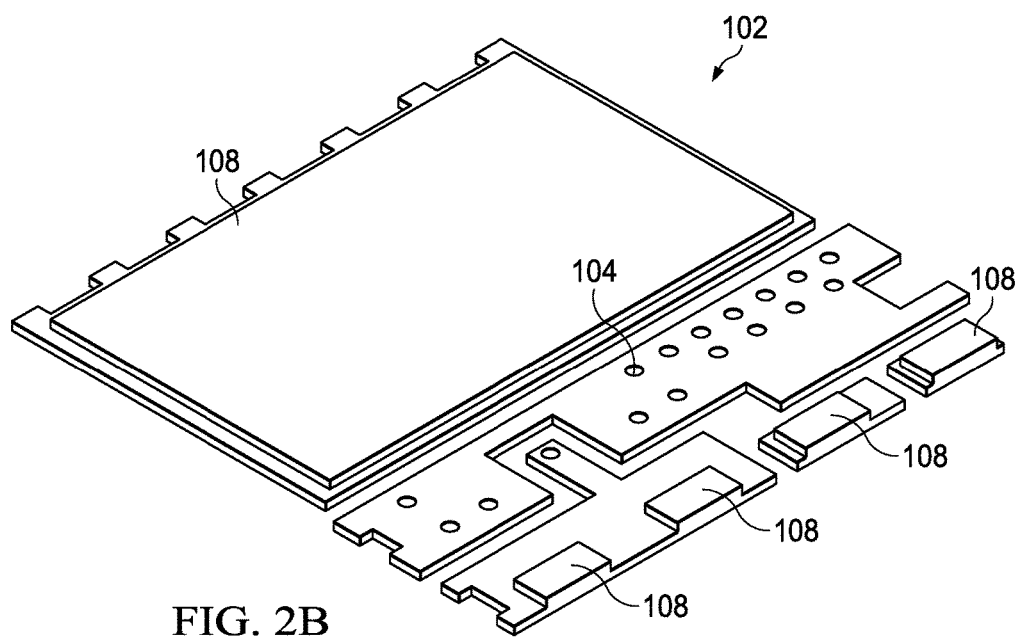
FIG. 2B is a perspective view of the lead frame surfaces depicted in FIG. 1B.

FIG. 1C is a side view of the lead frame 102 of FIG. 1A from the perspective of numerals 110. As shown, the thickness of the lead frame 102 in areas that have been half-etched (marked as numeral 112) is approximately half that of areas that have not been half-etched (marked as numeral 108). To provide additional clarity, FIG. 2A is a perspective view of the lead frame surface depicted in FIG. 1A, and FIG. 2B is a perspective view of the lead frame surfaces depicted in FIG. 1B.

Figure 3:
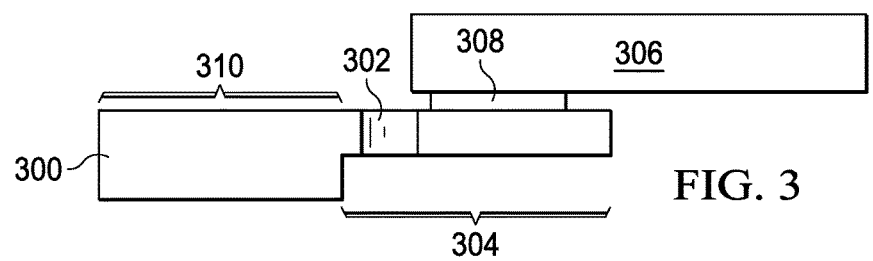
FIG. 3 is a side view of a lead frame having a hole formed therein and a die and die attach material positioned thereupon.

FIG. 3 is a side view of an illustrative lead frame 300 having a hole 302 formed in a half-etched area 304 and further having a die 306 and die attach material 308 positioned thereupon. The lead frame 300 also comprises a non-half-etched area 310. The die attach material 308, and, more generally, any die attach material described herein may comprise epoxy, polyimide, silicone or hybrid organic adhesives, and/or soft or eutectic solders, and it may be deposited in gel, paste, film, tape, or solder form. Any such die attach material, when reflowed, may be referred to herein as "fluid," irrespective of the viscosity of the material.

Figure 4A:
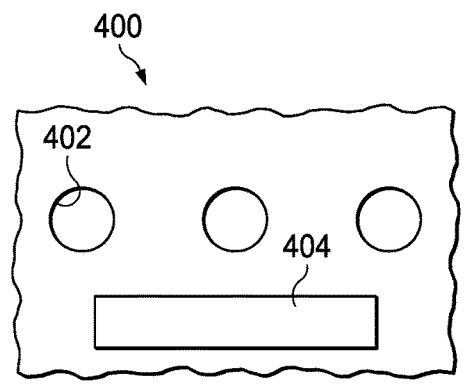
FIG. 4A is a top-down view of a portion of a lead frame having multiple holes and die attach material deposited thereupon.
Figure 4B:
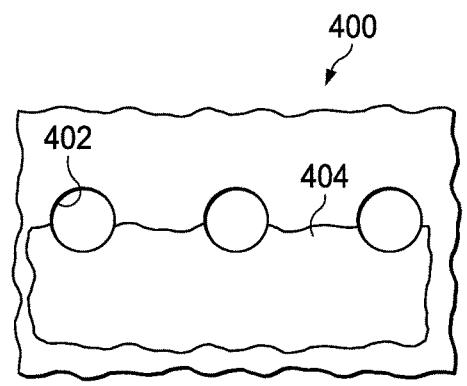
FIGS. 4B and 4C are top-down views of the portion of the lead frame depicted in FIG. 4A, with the die attach material having been reflowed.
Figure 4C:
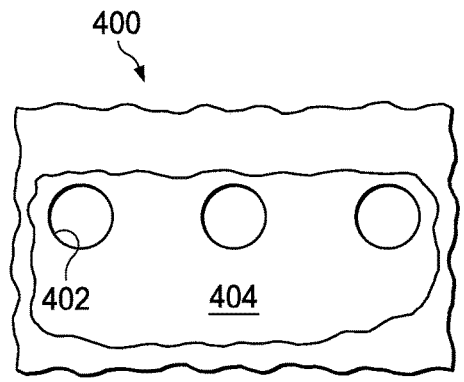

When the die attach material 308 is reflowed, its tensile characteristics will either prevent the material 308 from entering the hole 302, or, in some cases, the material 308 will enter the hole 302 but will not pass entirely through the hole 302. In some cases, the material 308 may encircle part or all of the aperture of the hole 302, or it may straddle the aperture of the hole 302 (i.e., cover the aperture of the hole without entering it). At least some such flow possibilities are described with respect to FIGS. 4A-4C. Specifically, FIG. 4A is a top-down view of a portion of an illustrative lead frame 400 having multiple holes 402 and die attach material 404 deposited thereupon (e.g., printed solder). The die attach material 404 is caused to flow—for instance, by a reflow process. As a result, the die attach material 404 may flow and eventually settle as depicted in FIG. 4B, which shows the material 404 partially encircling the holes 402. The tensile characteristics of the die attach material 404 preclude the material 404 between the holes from flowing substantially beyond the area of the holes. FIG. 4C is another top-down view of the portion of the lead frame 400 depicted in FIG. 4A, with the die attach material 404 having been reflowed in a different pattern. As shown, the material 404 straddles the holes 402 without substantially entering the holes 402, or, in some cases, without entering the holes 402 more than approximately halfway. Various such flow patterns are possible depending on a variety of factors, but in each case, the holes 402 effectively control solder flow and thus mitigate electrical shorts and/or poor electrical connections.

Figure 5A:
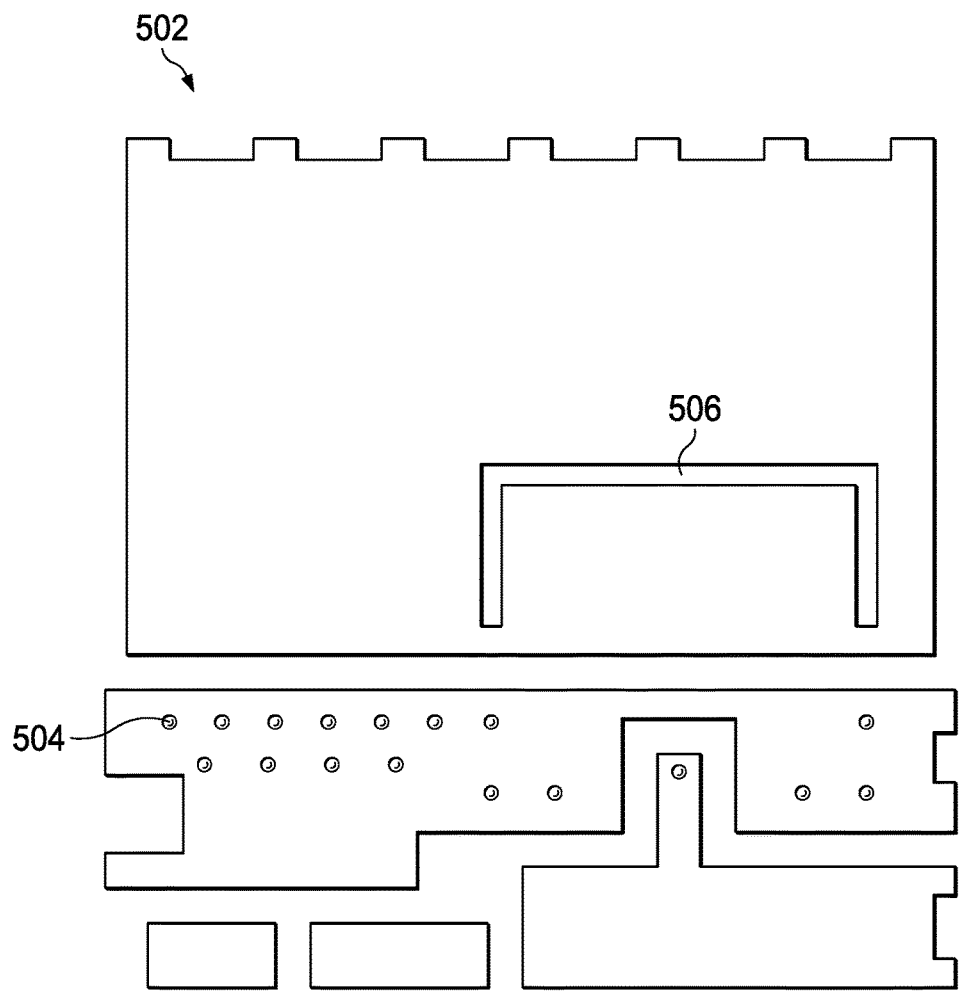
FIG. 5A is a top-down view of an illustrative lead frame having multiple dimples.

FIG. 5A is a top-down view of an illustrative lead frame 502 having multiple dimples 504. Dimples differ from holes in that they do not pass completely through the lead frame on which they are formed. Additionally, they may be smaller in diameter than holes, since the etching process generally will etch less deeply when the aperture diameter is smaller. The specific aperture diameter threshold above which a particular etching process will create a hole rather than a dimple is application-specific. As with holes, however, the dimples 504 can be created in any suitable number, arrangement, pitch, location, size, and shape. For example, holes and dimples may be etched as semi-circles, ovals, rectangles, and the like. The typical dimple 504 will have an aperture diameter ranging between 0.0254 mm and 0.1016 mm, inclusive, depending on material thickness, although the scope of this disclosure is not limited as such. The lead frame 502 may additionally include a trench 506.

Figure 5B:
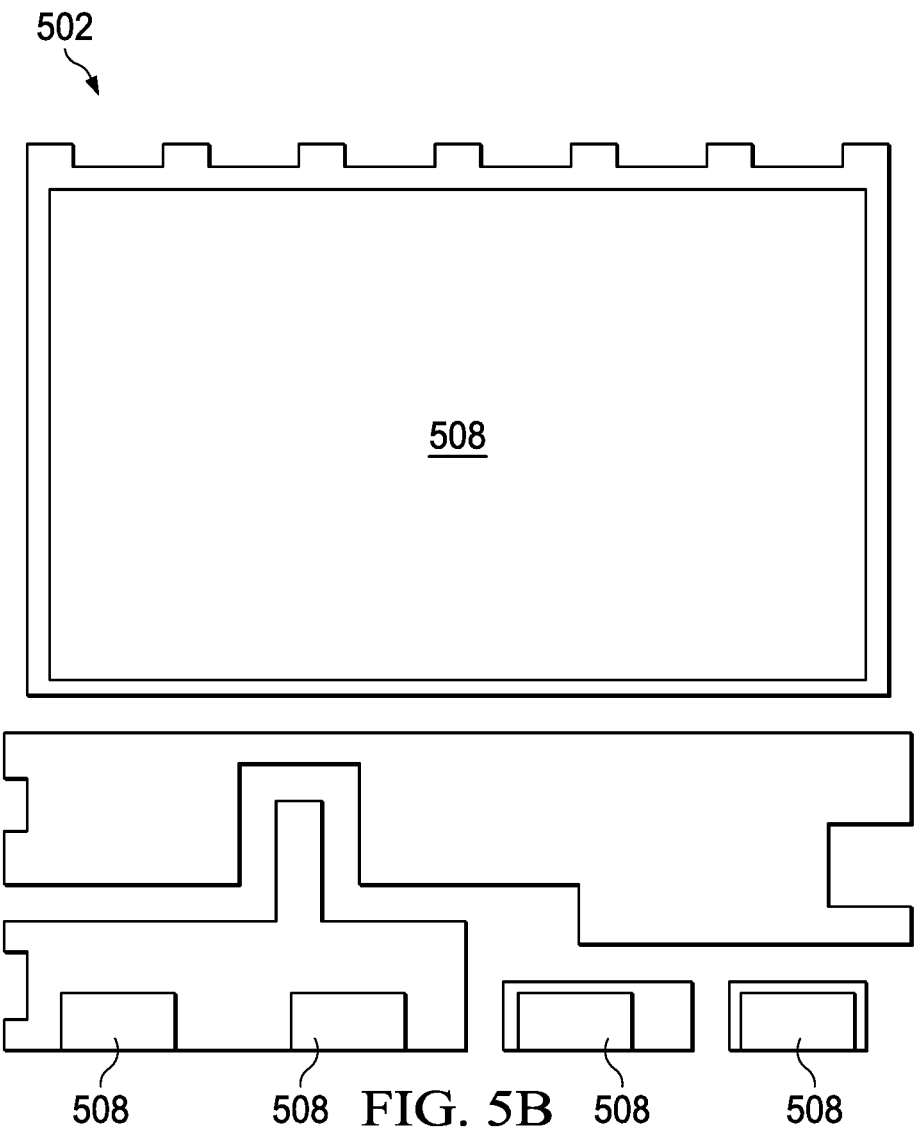
FIG. 5B is a bottom-up view of the lead frame of FIG. 5A.
Figure 6A:
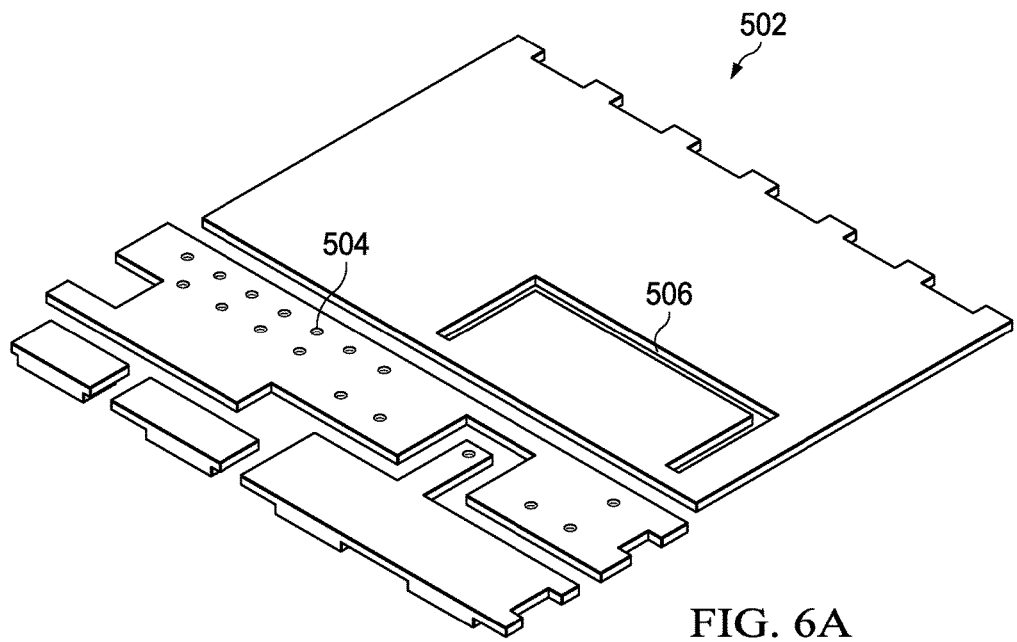
FIG. 6A is a perspective view of the lead frame surface depicted in FIG. 5A.
Figure 6B:
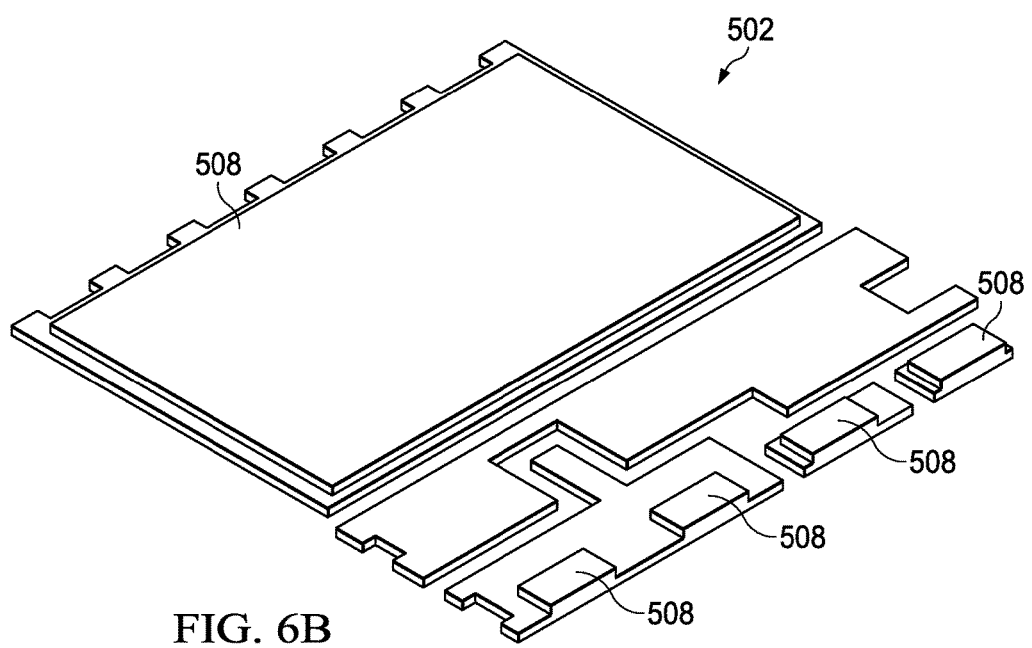
FIG. 6B is a perspective view of the lead frame surfaces depicted in FIG. 5B.

FIG. 5B is a bottom-up view of the lead frame 502 of FIG. 5A. The dimples 504 are formed in half-etched areas (as opposed to non-half-etched areas 508), but because the dimples 504 do not pass through the lead frame, they are not visible in FIG. 5B. The scope of disclosure is not limited to forming dimples only in half-etched areas; dimples may be formed in non-half-etched areas 508. To provide additional clarity, FIGS. 6A and 6B show perspective views of the lead frame 502 depicted in FIGS. 5A and 5B.

Figure 7:
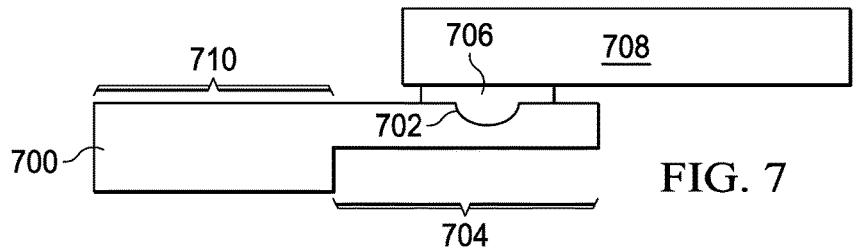
FIG. 7 is a side view of a lead frame having a dimple formed therein and a die and die attach material positioned thereupon.

FIG. 7 is a side view of an illustrative lead frame 700 having a dimple 702 formed therein and a die 708 and die attach material 706 positioned thereupon. The dimple 702 is formed in a half-etched area 704, and the lead frame 700 also includes a non-half-etched area 710. In at least some embodiments, the die attach material 706 is deposited directly into or over the dimple 702. When the die attach material 706 is reflowed, it fills the dimple 702. A sufficient amount of die attach material 706 is preferably deposited so that it fills the dimple 702 and overflows outside the dimple 702 so that a proper electrical connection may be formed with the die 708. However, the scope of disclosure is not limited to using the dimple 702 as shown. For example, the dimple 702 may be used as the hole 302 is used in FIG. 3, meaning that the die attach material is deposited adjacent to the dimple 702 and permitted to flow toward the dimple 702. The dimple 702, together with the tensile properties of the die attach material and any other dimples that may be positioned in the vicinity of the dimple 702, preclude the die attach material from flowing substantially beyond the dimple(s).

Figure 8A:
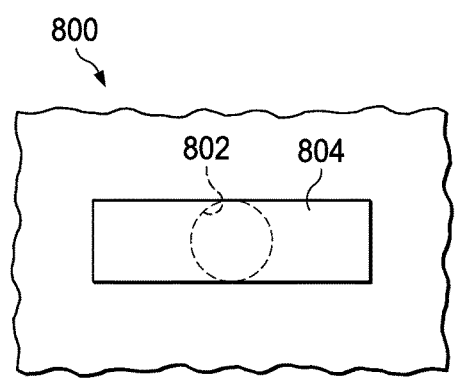
FIGS. 8A and 8C are top-down views of portions of lead frames having dimples and die attach material deposited thereupon.
Figure 8B:
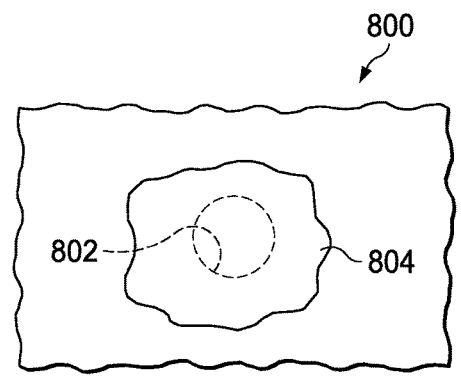
FIGS. 8B and 8D are top-down views of the portions of lead frames depicted in FIGS. 8A and 8C, respectively, with the die attach material having been reflowed.
Figure 8C:
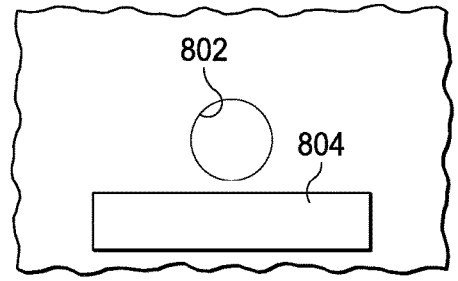
Figure 8D:
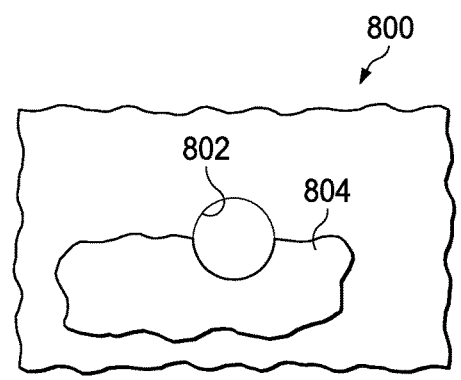

FIG. 8A is a top-down view of a portion of a lead frame 800 having a dimple 802 and die attach material 804 thereupon. As shown, the die attach material is printed or otherwise deposited directly on or above the dimple 802. When reflowed, the die attach material 804 may flow in the pattern shown in FIG. 8B. In FIG. 8B, the die attach material 804 fills some or all of the dimple 802. FIG. 8C is another top-down view of a portion of the lead frame 800 having a dimple 802 and die attach material 804 deposited thereupon. In FIG. 8C, the die attach material 804 is deposited adjacent to, rather than on top of, the dimple 802. FIG. 8D shows the flow pattern of the die attach material 804 when reflowed. As shown, the reflowed die attach material 804 encircles at least part of the dimple aperture and may at least partially fill the dimple 802. The scope of disclosure is not limited to any particular flow pattern, and no particular flow pattern is guaranteed to result from any particular type or configuration of die attach material. For example, when the die attach material 804 in FIG. 8C is reflowed, it may produce a flow pattern like that in FIG. 8B rather than that depicted in FIG. 8D. Any and all such variations are contemplated and fall within the scope of this disclosure.

Figure 9A:
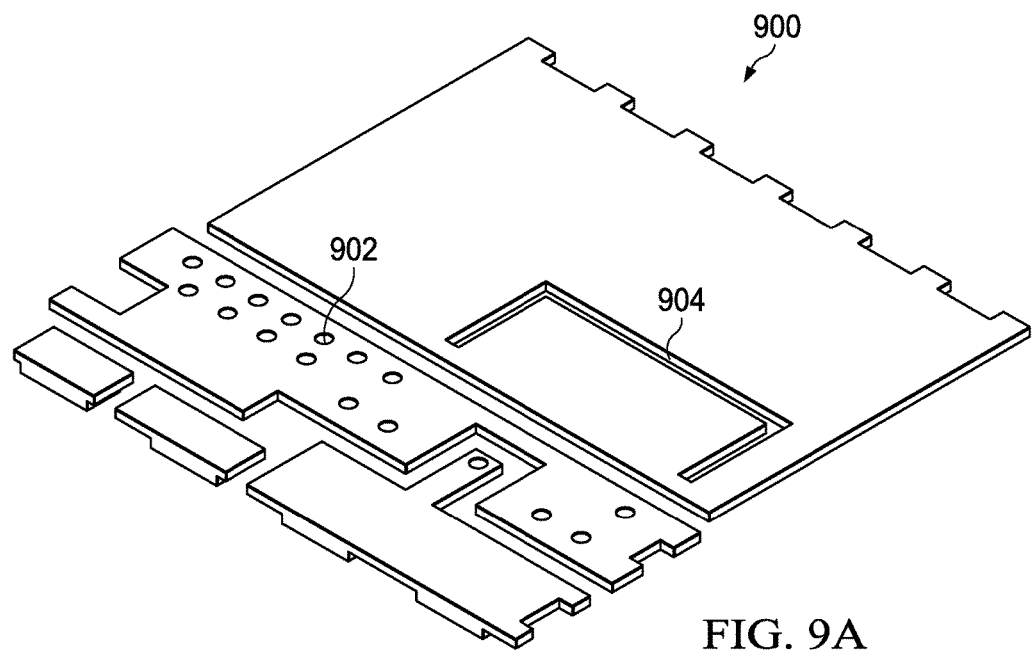
FIGS. 9A-9E are perspective views of an illustrative lead frame die attach and clip bonding process, in accordance with various embodiments.

FIGS. 9A-9E are perspective views of an illustrative lead frame die attach and clip bonding process, in accordance with various embodiments. Specifically, FIG. 9A depicts a lead frame 900 having a plurality of holes and/or dimples 902 and a trench 904. As explained above, the holes and/or dimples 902 are etched at the same time that the lead frame 900 is etched using the appropriate mask(s).

Figure 9B:
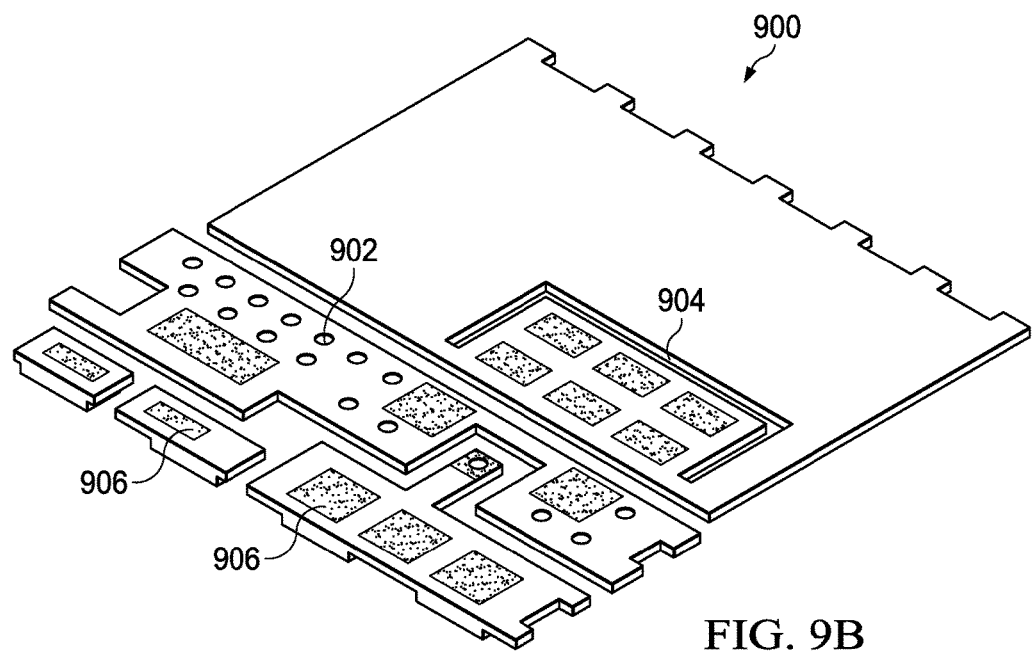
Figure 9C:
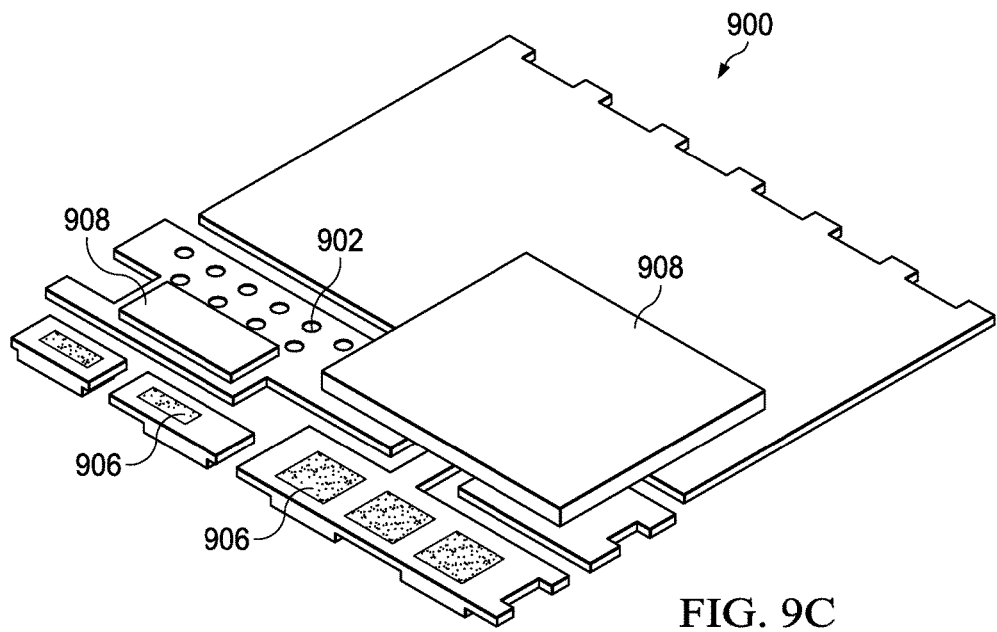
Figure 9D:
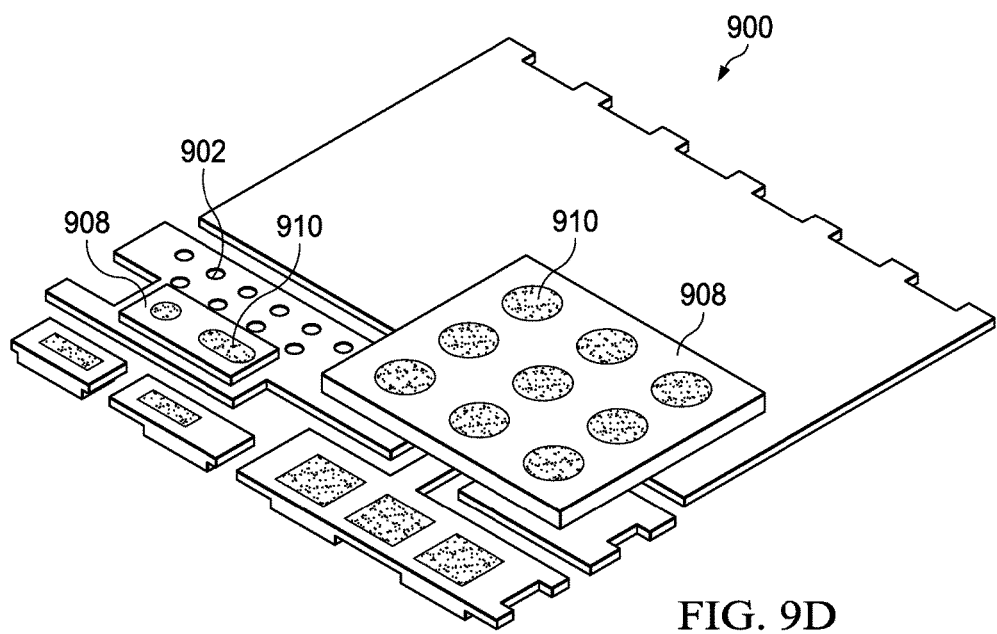
Figure 9E:
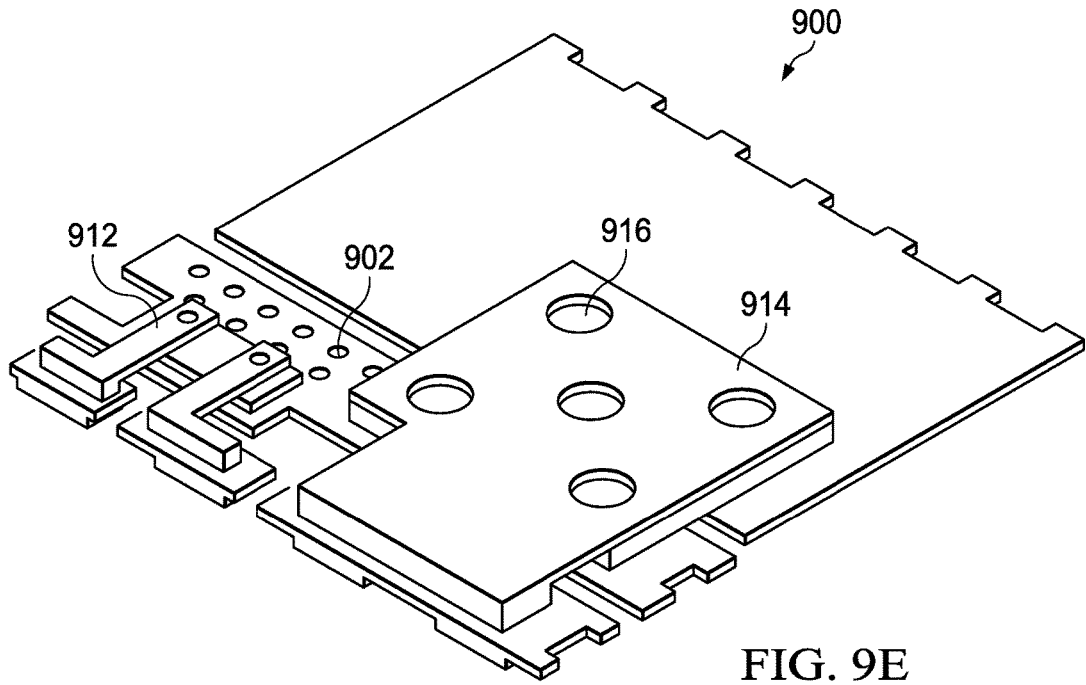

FIG. 9B depicts die attach material 906 having been deposited adjacent to, or directly on, the holes and/or dimples 902. FIG. 9C depicts multiple die 908 being positioned on the lead frame 900. As previously explained, the trench 904 can help one of the die 908 maintain proper position and prevent the die from sliding, and so one of the die 908 is positioned along the trench 904, as shown. FIG. 9D shows additional die attach material 910 being deposited atop the multiple die 908. FIG. 9E depicts clips 912, 914 being coupled to the die attach material on the lead frame 900 and on the die 908, as shown. This coupling establishes electrical connections between the lead frame 900 and the multiple die 908.

In addition, FIG. 9E depicts the clip 914 having multiple holes 916, each of which is positioned to align with one or more depositions of die attach material 910 atop the die 908. When reflowed, the die attach material 910 atop the die 908 flows through the holes 916 instead of being squeezed out from between the edges of the die 908 and the clip 914. Due to these holes 916, the clip 914—like the die 908—remains in position and does not slide. In some embodiments, dimples may be formed in the clip 914 in addition to, or in lieu of, the holes 916.

Figure 10:
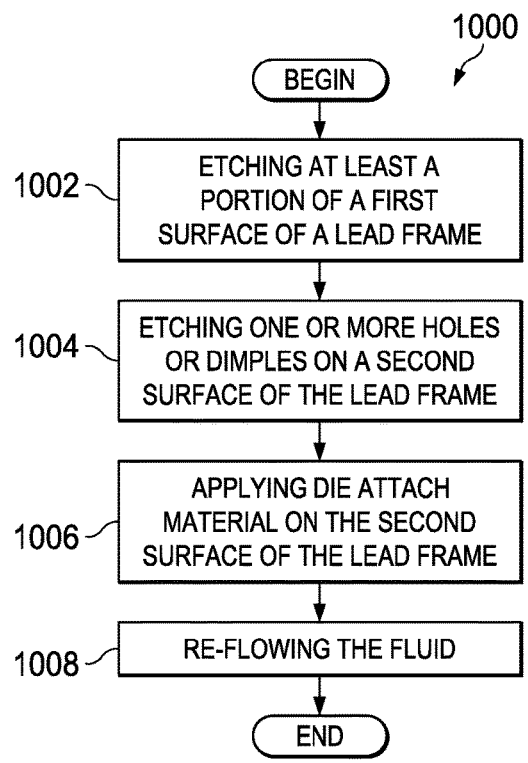
FIG. 10 is a flow diagram of an illustrative process in accordance with various embodiments.

FIG. 10 is a flow diagram of an illustrative process 1000 in accordance with various embodiments. The process 1000 begins by etching at least a portion of a first surface of a lead frame (step 1002). This step includes half-etching at least a portion of the first surface. The process 1000 continues by etching one or more holes or dimples on a second surface of the lead frame (step 1004). The lead frame may have holes, dimples, or a combination thereof. As explained, the holes preferably are formed in areas that have been half-etched so that the holes pass completely through the lead frame. Dimples preferably are formed in half-etched areas as well. The scope of disclosure, however, includes forming dimples in non-half-etched areas. The process 1000 also includes applying die attach material on the second surface of the lead frame in selectively targeted areas (step 1006). The die attach material is then reflowed, and the flow of the die attach material is controlled by the holes and/or dimples (step 1008). The method 1000 may be modified by adding, removing, modifying, or rearranging one or more steps.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:
1. A system, comprising:
 a first surface of a lead frame;
 a second surface of the lead frame, opposite the first surface, said second surface having been etched;
 one or more cylindrical holes passing through said lead frame and coincident with the first and second surfaces; and fluid on the first surface, the fluid at least partially encircling an aperture of said one or more holes, wherein said one or more holes are adapted to control flow of the fluid on said first surface.

2. The system of claim 1, wherein said fluid comprises reflowed solder.

3. The system of claim 1, wherein said second surface comprises a half-etched area.

4. The system of claim 1, wherein said fluid has a distribution on the first surface that is influenced at least in part by said one or more holes.

5. The system of claim 1, wherein said fluid partially fills said one or more holes.

6. The system of claim 1, wherein said fluid straddles at least one aperture of said one or more holes.

7. The system of claim 1, wherein said fluid is selected from the group consisting of epoxy, polyimide, silicone adhesives, hybrid organic adhesives, soft solder, and eutectic solder.

8. The system of claim 1, further comprising a die coupled to the first surface using solder, a position of the die on the first surface is influenced at least in part by said one or more holes.

9. The system of claim 8, further comprising a clip coupling said lead frame to the die using solder, said clip having one or more additional holes, a position of the clip relative to the die determined at least in part by said one or more additional holes.

10. The system of claim 1, further comprising one or more dimples positioned on said first surface and opposite the second surface, said one or more dimples are adapted to control said fluid flow on the first surface.

11. A system, comprising:
a lead frame having a lead frame surface;
one or more dimples formed upon the lead frame surface, said one or more dimples adapted to control fluid flow on said lead frame surface; and
fluid on the lead frame surface, said fluid straddling at least one aperture of the one or more dimples.

12. The system of claim 11, further comprising a second lead frame surface opposite the lead frame surface, said second lead frame surface having been half-etched.

13. The system of claim 11, wherein a distribution of said fluid on the lead frame surface is determined at least in part by said one or more dimples.

14. The system of claim 11, further comprising a die coupled to the lead frame surface using said fluid, a position of the die on the lead frame surface is influenced at least in part by said one or more dimples.

15. The system of claim 11, further comprising one or more holes passing through the lead frame, said one or more holes adapted to control flow of said fluid on the lead frame surface.

16. A method, comprising:
etching at least a portion of a first surface of a lead frame;
etching one or more holes and one or more dimples on a second surface of the lead frame, said first and second surfaces opposing each other, said one or more holes and one or more dimples configured to control solder flow;
applying solder on the second surface of the lead frame; and
reflowing said solder,
wherein the at least one dimple has an aperture with a smaller diameter than an aperture of said at least one hole.

17. The method of claim 16, further comprising said one or more holes and one or more dimples controlling flow of said reflowed solder.

18. The method of claim 16, further comprising forming at least one hole or dimple in a clip and using said clip to electrically couple a portion of said lead frame to a die.

* * * * *